(12) United States Patent
Ooishi et al.

(10) Patent No.: US 6,900,590 B2
(45) Date of Patent: May 31, 2005

(54) ORGANIC ELECTROLUMINESCENT DEVICE HAVING NON-CONTINUOUS METAL AUXILIARY ELECTRODES

(75) Inventors: Mitsuma Ooishi, Tokyo (JP); Yoshikazu Yamaguchi, Tokyo (JP); Eiichi Kitazume, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 200 days.

(21) Appl. No.: 09/975,929

(22) Filed: Oct. 15, 2001

(65) Prior Publication Data

US 2002/0043933 A1 Apr. 18, 2002

(30) Foreign Application Priority Data

Oct. 17, 2000 (JP) ........................................ 2000-316539

(51) Int. Cl.[7] .............................. H01J 1/62; H01J 63/04
(52) U.S. Cl. ........................ 313/512; 313/500; 313/505; 313/509; 445/25
(58) Field of Search ................................. 313/500, 505, 313/509, 512

(56) References Cited

U.S. PATENT DOCUMENTS 4,356,429 A * 10/1982 Tang .......................... 313/503
6,111,357 A * 8/2000 Fleming et al. ............. 313/509
6,344,661 B1 * 2/2002 Nagase et al. ................. 257/40

FOREIGN PATENT DOCUMENTS

| JP | 2-135694 | 5/1990 |
| JP | 11-085057 | 3/1999 |
| JP | 2000-021566 | 1/2000 |
| JP | 2000-36381 | 2/2000 |

* cited by examiner

*Primary Examiner*—Joseph Williams
*Assistant Examiner*—Matt Hodges
(74) *Attorney, Agent, or Firm*—McGuireWoods LLP

(57) ABSTRACT

An organic electroluminescent device according to the invention is provided with a transparent substrate, a transparent electrode formed on the transparent substrate, an organic thin film layer formed on the transparent electrode to be a front electrode in a display area, a back electrode formed opposite to the front electrode on the organic thin film layer, a metal auxiliary electrode to be leading wiring laminated on the transparent electrode outside the display area and a sealing member bonded and fixed to the transparent substrate so that it encircles the display area and is characterized in that one or plural locations which crosses/cross the metal auxiliary electrode and is/are non-continuous in the longitudinal direction of the metal auxiliary electrode is/are formed in the metal auxiliary electrode located in a bonded part of the transparent substrate and the sealing member.

23 Claims, 6 Drawing Sheets

ORGANIC ELECTROLUMINESCENT DEVICE HAVING NON-CONTINUOUS METAL AUXILIARY ELECTRODES

BACKGROUND OF THE INVENTION

1. Field of the Invention

The present invention relates to an organic electroluminescent device wherein a yield is enhanced, the permeation of moisture from the outside can be inhibited, the life is extended and the quality of display is enhanced.

2. Description of the Related Art

It is widely recognized that in today's advanced information society, a display which is an information terminal takes an important position of a man-machine interface.

Generally, it is CRT, that is, a conventional type cathode-ray tube that is used for a display, particularly a display for a personal computer, which has been recently remarkably popularized. In the meantime, for a personal computer, recently, the demand of a portable terminal has also increased.

For a purpose of using the above-mentioned portable terminal, conventional type CRT which is heavy and requires large space is not suitable and in place of it, a thin, light and flat-type display that further enables large capacity display has attracted attention.

The above-mentioned flat-type display includes many types such as a plasma display (PDP), a liquid crystal display (LCD), a vacuum fluorescent character display tube (VFD) and an electroluminescent (EL) display and has been variously developed in accordance with each property. Above all, an electroluminescent device has recently actively developed for a mobile telephone which is a mobile terminal.

An electroluminescent device is formed by sandwiching an organic luminescent layer between a transparent electrode and a back electrode. A hole and an electron are injected into the organic luminescent layer by applying voltage between both electrodes. Then, a fluorescent substance in the organic luminescent layer is excited by energy generated in the recombination of these and light radiated when the excited fluorescent substance returns to a ground state is utilized. For the above-mentioned transparent electrode of such an electroluminescent device, a transparent conductive thin film such as indium-tin oxide (ITO) is used to transmit emission from the organic luminescent layer.

In the organic luminescent layer of the electroluminescent device, the deterioration of a property by moisture is remarkable, for example, when the organic luminescent layer comes in contact with moisture in air, chemical change occurs, the quality of display is deteriorated and the life of emission is reduced. Therefore, in a conventional type electroluminescent device, as disclosed in Japanese published unexamined patent application No. 2000-21566, an organic luminescent device is protected by bonding a sealing member 14 to a transparent electrode 12 provided on a transparent substrate 11 or an auxiliary electrode 13 provided on the transparent electrode by an adhesive 15 and holding sealed space in inert atmosphere (see FIG. 1).

Also, in Japanese published unexamined patent application No. Hei 11-85057, a color liquid crystal panel in which a part of an electrode line 21 crossing the sealing member 23 is a transparent conductive layer 22 and a color liquid crystal panel in which a part of an electrode line 31 crossing the sealing member 33 has an opening 34 and a transparent conductive layer 32 is laminated in an area including the opening are disclosed (see FIGS. 2 and 3).

According to an electroluminescent device disclosed in Japanese published unexamined patent application No. 2000-21566, the enhancement of the quality of display is recognized to some extent, however, when ultraviolet rays are irradiated from the side of the outside face of a transparent substrate and an adhesive is cured, an uncured part may be left in a bonded part because an auxiliary electrode is made of opaque metallic material and a problem that moisture easily permeates cannot be avoided.

In the meantime, according to the color liquid crystal panel disclosed in Japanese published unexamined patent application No. Hei 11-85057 and devised in the part of the electrode line crossing the sealing member, the enhancement of the adhesion property to some extent is recognized, however, for example, there are problems that in the color liquid crystal panel shown in FIG. 2, as only the transparent electrode is independently formed in the sealing part, resistance increases and in the one shown in FIG. 3, as there is a part in which the metal electrode line is continuous longitudinally in the sealing part, an adhesion property between the adhesive and the metal becomes weak, moisture easily permeates and the life is reduced.

SUMMARY OF THE INVENTION

Therefore, the object of the invention is to provide an organic electroluminescent device which is advantageous to inhibit the permeation of moisture from the outside and which enables the low resistance of leading wiring.

Another object of the invention is to provide an organic electroluminescent device in which satisfactory adhesion between a transparent substrate and a sealing member is held, the life is extended and the quality of display is enhanced at a high yield.

The organic electroluminescent device according to the invention is provided with a transparent substrate, a transparent electrode formed on the transparent substrate, an organic thin film layer formed on the transparent electrode to be a front electrode in a display area, a back electrode formed opposite to the front electrode on the organic thin film layer, a metal auxiliary electrode to be leading wiring laminated on the transparent electrode outside the display area and a sealing member bonded and fixed to the transparent substrate so that the sealing member encircles the display area and is characterized in that one or plural locations that crosses/cross the metal auxiliary electrode and is/are non-continuous in the longitudinal direction of the metal auxiliary electrode is/are formed in the metal auxiliary electrode located in a part in which the transparent substrate and the sealing member are bonded.

That is, in a part in which leading wiring acquired by laminating the metal auxiliary electrode on the transparent electrode and the sealing member are crossed, one or plural non-continuous parts (a part/parts in which the transparent electrode is exposed) of the metal electrode in the longitudinal direction of the leading wiring is/are formed so that it/they crosses/cross the leading wiring.

In the organic electroluminescent device according to the invention, moisture permeates from the outside into sealed space via an adhesive part between the sealing member and the transparent substrate. For the part in which the sealing member and the transparent substrate are bonded, a part in which the sealing member and the transparent substrate are directly bonded via an adhesive and a part in which the sealing member and the leading wiring provided on the transparent substrate are bonded via an adhesive exist. The bonded state of the former is relatively satisfactory, while the bonded state of the latter is often insufficient. This reason is that as described above, when ultraviolet rays are irradiated on the bonded part of both from the side of the outside face of the transparent substrate to bond the sealing member and the transparent substrate, the curing of the adhesive in a part in which an opaque metal electrode is laminated for the leading wiring is insufficient. That is, in a part in which the metal auxiliary electrode and the sealing member are bonded, an un cured part of the adhesive is left, bonding is often insufficient and in the prior art shown in FIG. 1, moisture often permeates into the sealed space from the outside via this part. As the following bonded state is satisfactory in case the part that crosses the sealing member of the leading wiring is formed by only the transparent electrode as in the prior art shown in FIG. 2, the permeation of moisture from the outside can be inhibited, however, as the resistivity of the transparent electrode is large, wiring resistance increases when area formed by only the transparent electrode is increased, driving voltage increases and it is not desirable. As a part continuous in the longitudinal direction of the metal auxiliary electrode exists in case the opening of the metal electrode is formed in the part that crosses the sealing member of the leading wiring in an isolated state as in the prior art shown in FIG. 3, the adhesion property of this part becomes weak, moisture often permeates via this part and it is not desirable.

In the organic electroluminescent device according to the invention, in the part that the sealing member and the leading wiring are crossed, one or plural parts in which the transparent electrode is exposed, that is, one or plural non-continuous parts of the metal auxiliary electrode is/are formed so that it/they crosses/cross the metal auxiliary electrode. As described above, in the organic electroluminescent device according to the invention, a place having no metal auxiliary electrode and having only the transparent electrode exists in the leading wiring in the bonded part by providing the part in which the transparent electrode is exposed so that it crosses the leading wiring, therefore, an adhesion property between the leading electrode and the sealing member is enhanced and the permeation of moisture from the outside is inhibited in the non-continuous part of the metal auxiliary electrode. Therefore, the organic electroluminescent device the life of which is extended and the quality of display of which is enhanced can be provided at a high yield.

When the part in which the transparent electrode is exposed is formed so that the length of the opposite part of a pair of opposite metal electrodes in the part in which the leading wiring and the sealing member are bonded is longer than the width of the leading electrode, it is advantageous to reduce the resistance of the leading wiring.

Also, the organic electroluminescent device according to the invention is an organic electroluminescent device in which area occupied by the part in which the transparent electrode is exposed in the part in which the leading wiring and the sealing member are bonded is in the range of 50 to 90% of the whole area of the bonded part. Adhesion in the part in which the leading wiring and the sealing member are bonded is fully satisfactorily held owing to such configuration and effect for inhibiting the permeation of moisture from the outside further increases.

BRIEF DESCRIPTION OF THE DRAWINGS

The above and other objects, features and advantages of the present invention will become more apparent from the following detailed description when taken in conjunction with the accompanying drawing wherein.

DESCRIPTION OF THE PREFERRED EMBODIMENTS

Figure 1:
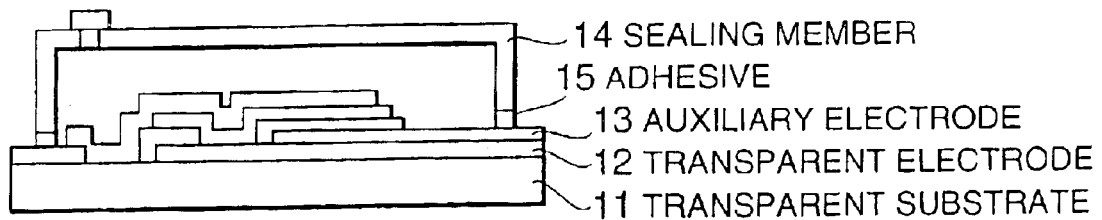
FIG. 1 is a sectional view showing a conventional type organic electroluminescent device.
Figure 2:
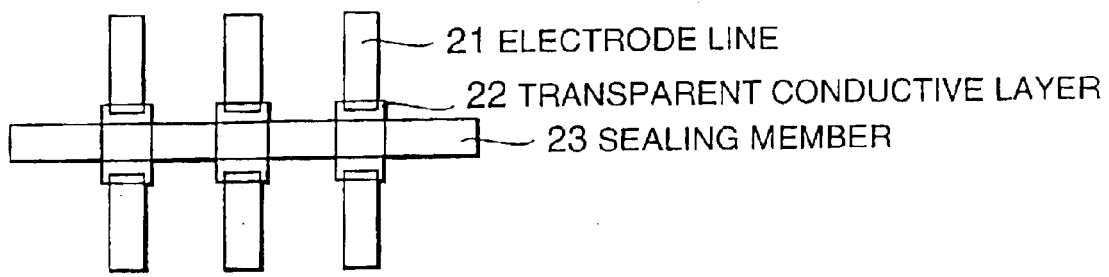
FIG. 2 is a plan showing a part in which an electrode line of a conventional type color liquid crystal panel crosses sealing member.
Figure 3:
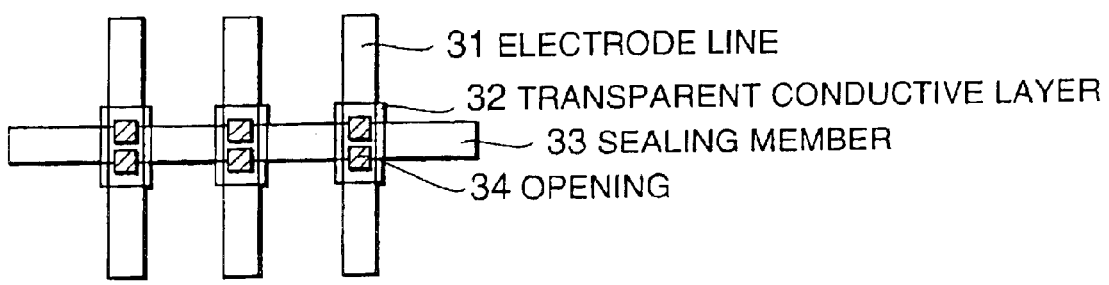
FIG. 3 is a plan showing a part in which an electrode line of a conventional type color liquid crystal panel crosses sealing member.

Referring to the drawings, an organic electroluminescent device according to the invention will be described below.

Figure 4:
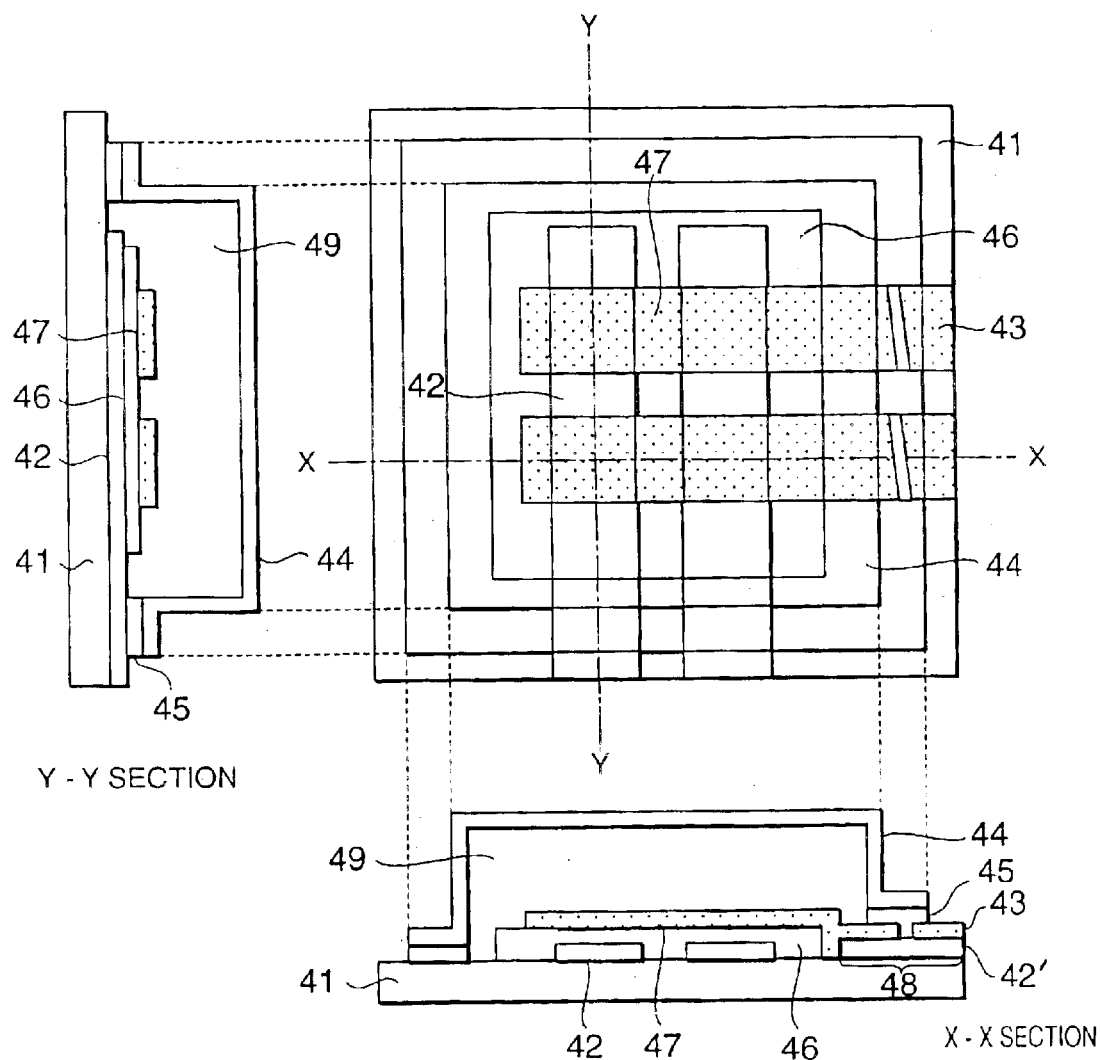
FIG. 4 is a plan and sectional views taken along the lines X—X and Y—Y in the plan showing an example of an organic electroluminescent device according to the invention.

FIG. 4 is a plan and sectional views taken along the lines X—X and Y—Y in the plan showing an example of the organic electroluminescent device according to the invention. In this example, electroluminescent elements composing picture elements are arrayed in two rows and two columns. As shown in FIG. 4, a transparent electrode 42 to be a front electrode is formed in a display area and a transparent electrode 42' composing leading wiring is formed respectively on a transparent substrate 41. An organic electroluminescent element is formed by forming an organic thin film 46 on the transparent electrode 42 and laminating a back electrode 47 opposite to the transparent electrode 42 on the organic thin film 46. In the meantime, a metal auxiliary electrode 43 is laminated on the transparent electrode 42' and leading wiring 48 is formed. A sealing member 44 located so that it covers the organic electroluminescent element is bonded and fixed over the transparent substrate 41 and the leading wiring 48 by an adhesive 45. Inert gas or inert liquid 49 is filled with the space between the sealing member 44 and the transparent substrate 41. In the example shown in FIG. 4, the metal electrode 43 and the back electrode 47 are continuously formed.

For material used for manufacturing the organic electroluminescent device according to the invention, material used for manufacturing a general organic electroluminescent device can be used without a limit. For example, for the transparent substrate 41 shown in FIG. 4, soda-lime glass, plastic and others to which degreasing cleaning is applied can be used. The transparent electrodes 42 and 42' are made of transparent conductive material such as ITO and tin oxide. The metal auxiliary electrode 43 is made of material the resistivity of, which is smaller, compared with the transparent electrode 42 and is generally made of metallic conductive material such as chromium (Cr). The organic thin film 46 may also have two-layer structure composed of a hole transport layer and a luminescent layer or a luminescent layer and an electron transport layer or three-layer structure composed of a hole transport layer, a luminescent layer and an electron transport layer in addition to single-layer structure including only a luminescent layer.

For the luminescent layer, fluorescent lightening agent such as benzoxazole, benzothiazole and benzimidazole, a metal chelate oxynoid compound, a styrylbenzene compound, a distilpyrazine derivative, a naphthalimide derivative, a perylene derivative, an oxadiazole derivative, an aldazine derivative, a cyclopentadiene derivative, a styrylamine derivative, a coumarin derivative and an aromatic dimethylidyne derivative are used.

For the hole transport layer, organic material such as a triphenylamine derivative, aromatic tertiary amine, a stilbene compound, a triazole derivative, an oxadiazole derivative, an imidazole derivative, a polyarylalkane derivative, a pyrazoline derivative, a pyrazolone derivative, a phenylenediamine derivative, an arylamine derivative, an amino substitutive chalcone derivative, an oxazole derivative, a styrylanthracene derivative, a fluorenone derivative, a hydrazone derivative, a silazane derivative, a polysilane-aniline copolymer and poly-3-methylthiophene is used.

For the electron transport layer, a dioxadiazole derivative, an anthraquinodimethane derivative and a diphenylquinone derivative are used.

The back electrode 47 is made of metallic conductive material such as chromium (Cr) or aluminum (Al). In FIG. 4, the example that the back electrode is connected to the metal auxiliary electrode 43 and is integrated with the metal auxiliary electrode by the same material as that of the metal auxiliary electrode is shown, however, they are not necessarily required to be integrated by the same material.

For the sealing member 44, the same material as that of the transparent substrate 41 and metallic material such as stainless steel are used.

For the inert gas 49, for example, nitrogen and argon are used and for the inert liquid 49, for example, fluoric liquid is used.

For the adhesive 48, an ultraviolet cured adhesive is used. Generally, to bond a sealing material and leading wiring, an ultraviolet cured adhesive is applied, ultraviolet rays are irradiated from the side of the substrate after both are bonded, thus the adhesive is cured.

When ultraviolet rays are irradiated, the luminescent layer is shielded so that ultraviolet rays are not directly irradiated on the luminescent layer because the organic thin film is deteriorated when ultraviolet rays are irradiated on the organic thin film.

In the organic electroluminescent device according to the invention, one or plural parts in which the transparent electrode is exposed (or one or plural parts in which the metal auxiliary electrode is non-continuous) is/are formed in the leading wiring located in the bonded part to the sealing member so that it/they crosses/cross the leading wiring.

A pair of metal auxiliary electrodes are formed on each leading wiring. A word, "a pair" means a metal auxiliary electrode for the leading wiring connected to the outside of the sealing member and a metal auxiliary electrode for the leading wiring connected to the inside of the sealing member.

Figure 5A:
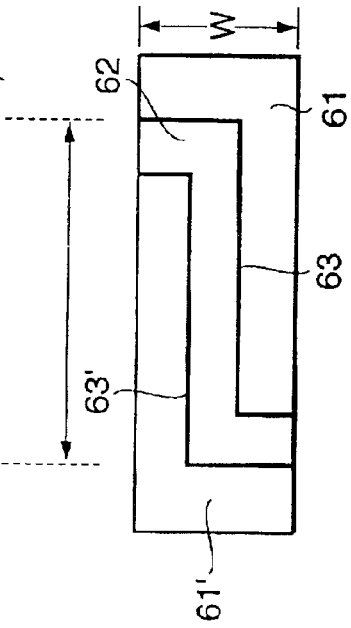
FIGS. 5A and 5B are plans showing first and second embodiments of a part in which leading wiring and a sealing member of the organic electroluminescent device according to the invention are bonded.
Figure 5B:
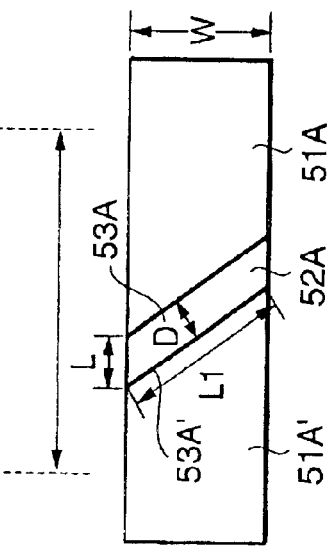

FIGS. 5A and 5B are plans respectively showing first and second embodiments of a bonded part of leading wiring and a sealing member in the organic electroluminescent device according to the invention. As shown in FIGS. 5A and 5B, parts 52A and 52B in which a transparent electrode is exposed are respectively arranged between a pair of metal electrodes 51A and 51'A and between 51B and 51'B in the shape of a band.

The length $L_2$ of the opposite parts 53B and 53'B of a pair of metal auxiliary electrodes in the bonded part shown in FIG. 5B of the leading wiring and the sealing member is the same as the width W of the leading wiring, while the length $L_1$ of the opposite parts 53A and 53'A of a pair of metal auxiliary electrodes in the bonded part shown in FIG. 5A of the leading wiring and the sealing member is longer than the width W of the leading wiring. Considering a case that the area of a part in which the transparent electrode is exposed in the shape of a band is the same (the length of the base or the height: L, the length of the height or the width: W), as distance between the opposite parts can be shortened (D'>D) by diagonally forming the transparent electrode exposed part in the shape of a band for the leading wiring, compared with a case that the transparent electrode exposed part in the shape of a band is formed perpendicularly to the leading wiring, the increase of the resistance value of the leading wiring can be reduced.

Next, other embodiments of a bonded part of leading wiring and a sealing member in the organic electroluminescent device according to the invention will be described.

Figure 6:
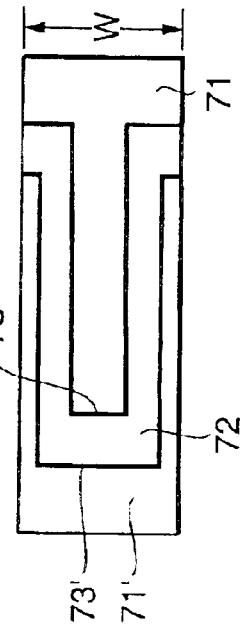
FIG. 6 is a plan showing a third embodiment of the part in which the leading wiring and the sealing member of the organic electroluminescent device according to the invention are bonded.
Figure 7:
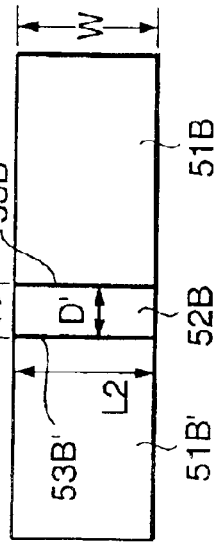
FIG. 7 is a plan showing a fourth embodiment of the part in which the leading wiring and the sealing member of the organic electroluminescent device according to the invention are bonded.

FIG. 6 is a plan showing a third embodiment of the bonded part of leading wiring and a sealing member in the organic electroluminescent device according to the invention. As shown in FIG. 6, an exposed part of a transparent electrode 62 (a non-continuous part between metal auxiliary electrodes 61 and 61') is formed between a pair of the metal auxiliary electrodes 61 and 61' in a cranked shape so that both side ends of the leading wiring are crossed. As illustrated in FIGS. 6 and 7, for example, the cranked shape of the non-continuous part may comprise two or more segments of the transparent electrode being connected at ninety degrees relative to each other. FIG. 6 illustrates 3 such segments, white FIG. 7 illustrates five such segments. Other numbers of segments may also be used. In FIG. 6, the length of each opposite part 63, 63' of a pair of metal auxiliary electrodes in the bonded part is also made longer than the width W of the leading wiring.

FIG. 7 is a plan showing a fourth embodiment of a bonded part of leading wiring and a sealing member in the organic electroluminescent device according to the invention. In FIG. 7, a part in which a transparent electrode 72 is exposed (a non-continuous part between metal auxiliary electrodes 71 and 71') is formed between a pair of metal auxiliary electrodes 71 and 71' so that both side ends of the leading wiring are crossed in a further complex cranked shape, compared with the shape shown in FIG. 6. In FIG. 7, the length of each opposite part 73 and 73' of a pair of metal auxiliary electrodes in the bonded part is made further longer than the width W of the leading wiring.

Figure 8:
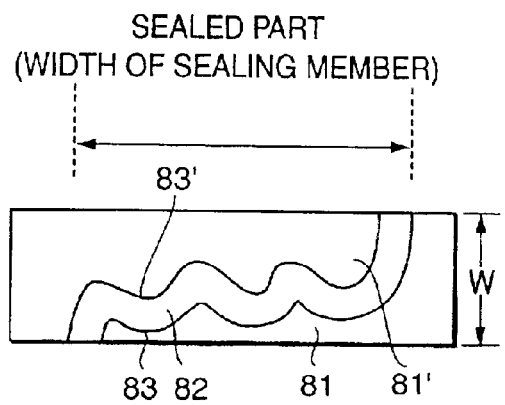
FIG. 8 is a plan showing a fifth embodiment of the part in which the leading wiring and the sealing member of the organic electroluminescent device according to the invention are bonded.

FIG. 8 is a plan showing a fifth embodiment of a bonded part of leading wiring and a sealing member in the organic electroluminescent device according to the invention. In FIG. 8, a part in which a transparent electrode 82 is exposed (a non-continuous part between metal electrodes 81 and 81') is formed between a pair of metal electrodes 81 and 81' so that both side ends of the leading wiring are crossed in a wavy shape. In FIG. 8, the length of each opposite part 83, 83' of a pair of metal auxiliary electrodes in the bonded part is also made longer than the width W of the leading wiring.

Figure 9:
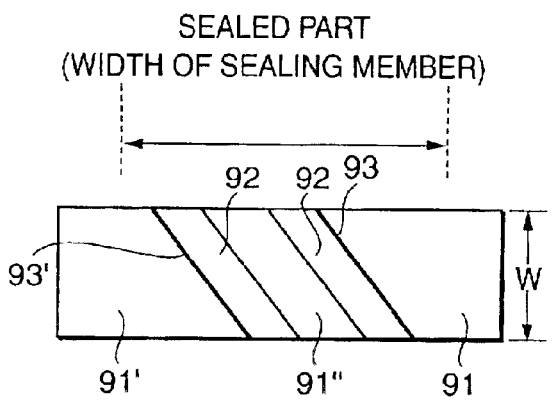
FIG. 9 is a plan showing a sixth embodiment of the part in which the leading wiring and the sealing member of the organic electroluminescent device according to the invention are bonded.

In the organic electroluminescent device according to the invention, two or more parts in the transparent electrode are exposed (or two or more non-continuous parts of the metal auxiliary electrode) may be also provided in the leading wiring located in the bonded part with the sealing member. FIG. 9 is a plan showing a sixth embodiment of a bonded part of leading wiring and a sealing member in the organic electroluminescent device according to the invention and two regions 92 in which a transparent electrode is exposed (or two non-continuous parts of a metal auxiliary electrode) are formed between a pair of metal electrodes 91 and 91', separated by an intermediate metal electrode portion 91", so that both side ends of the leading wiring are crossed. In FIG. 9, the length of each opposite part 93 and 93' of a pair of metal auxiliary electrodes in the bonded part is also made longer than the width W of the leading wiring.

Figure 10:
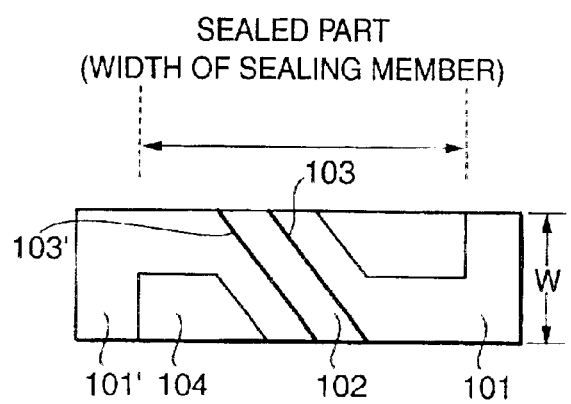
FIG. 10 is a plan showing a seventh embodiment of the part in which the leading wiring and the sealing member of the organic electroluminescent device according to the invention are bonded.

In each embodiment shown in FIGS. 5 to 9, the transparent electrode exposed part the length of each opposite part of which is substantially the same and which is in the shape of a band is shown, however, the length of each opposite part may be also different and the transparent electrode exposed part is not necessarily required to be formed in the shape of a band. As in a seventh embodiment shown in FIG. 10, an uncrossed part 104 may be also formed except a part 102 that crosses leading wiring in a transparent electrode exposed part between a pair of metal auxiliary electrodes 101 and 101'.

That is, in the organic electroluminescent device according to the invention, if a transparent electrode exposed part that crosses at least one leading wiring has only to be provided in the bonded part of the leading wiring and a sealing member, there is particularly no limit of a pattern, however, it is desirable because it is advantageous to reduce the resistance of the leading wiring that the length of each opposite part of a pair of opposite metal auxiliary electrodes in the transparent electrode exposed part in the bonded part of the leading wiring and the sealing member is formed longer than the width of the leading electrode.

It is desirable that area occupied by the transparent electrode exposed part in the bonded part of the leading wiring and the sealing member is in a range of 50 to 90% of the whole area of the bonded part. Satisfactory adhesion can be held by increasing the ratio of area occupied by the transparent electrode in the bonded part up to 50% or more of the whole area of the bonded part.

When the ratio of area occupied by the transparent electrode exposed part is increased, a resistance value of leading wiring has a tendency to increase, however, if a resistance value of the leading wiring is in a range of 30 Ω or less, it is not a particularly large problem. Therefore, a transparent electrode exposed part is not limited to only the bonded part of the leading wiring and the sealing member and can be also extended to the outside of the bonded part, however, as a resistance value of the leading wiring increases, it is not a desirable embodiment. When a resistance value of the leading wiring is larger than 30 Ω, voltage applied when the organic electroluminescent device is driven at fixed current is too high and it is not desirable. It is desirable that depending upon the area of the bonded part, the ratio of the area of the transparent electrode exposed part is 90% or less of the whole area of the bonded part.

As in the organic electroluminescent device according to the invention, a pair of metal auxiliary electrodes are formed as described above and one or plural parts in which the transparent electrode is exposed (or one or plural non-continuous parts of the metal auxiliary electrode) is/are formed between a pair of metal auxiliary electrodes and in the leading wiring located in the bonded part with the sealing member so that it/they cross the leading wiring, the organic electroluminescent device according to the invention has approximately 1.5 times of life (time until the luminescent area of a picture element decreases up to 50%), compared with an organic electroluminescent device in which a metal auxiliary electrode is formed in the whole bonded part.

For the adhesive to bond the sealing member and the leading wiring, generally a ultraviolet cured adhesive is used, however, as adhesive strength in case this adhesive is used and the sealing member and the transparent electrode are bonded is stronger than that in case this adhesive is used and the sealing member and the metal auxiliary electrode are bonded (in case glass is used the sealing member, ITO is used for the transparent electrode and nickel/chromium is used for the metal auxiliary electrode, adhesive strength between the sealing member and the metal auxiliary electrode is 1.3 to 2.2 N/mm$^2$ and adhesive strength between the sealing member and the transparent electrode is approximately 7 N/mm$^2$), adhesive strength between the sealing member and the leading wiring is increased enough by setting the ratio occupied by the transparent electrode to the above-mentioned range and the effect of inhibiting the permeation of moisture from the outside is produced.

Figure 11:
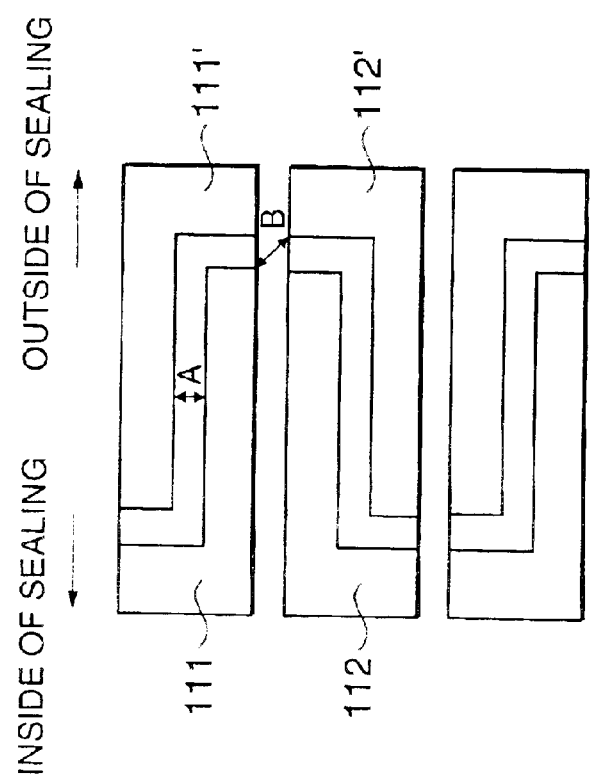
FIG. 11 is a plan showing an eighth embodiment of the part in which the leading wiring and the sealing member of the organic electroluminescent device according to the invention are bonded.

Next, referring to the drawings, furthermore embodiment of the organic electroluminescent device according to the invention will be described. FIG. 11 is a plan showing an eighth embodiment of a bonded part of leading wiring and a sealing member in the organic electroluminescent device according to the invention that distance between a continuous metal auxiliary electrode inside the sealing member and a continuous metal auxiliary electrode of the same leading wiring outside the sealing member respectively in the bonded part of the leading wiring and the sealing member is shorter than distance between the continuous metal auxiliary electrode inside the sealing member and a continuous metal auxiliary electrode of adjacent leading wiring outside the sealing member.

In FIG. 11, a transparent electrode exposed pattern of the bonded part of the leading wiring and the sealing member is formed so that adjacent leading wirings via suitable space have the relation of a reflected image. Distance A between a continuous metal auxiliary electrode 111 of first leading wiring inside the sealing member and a continuous metal auxiliary electrode 111' of the first leading wiring outside the sealing member is made shorter than distance B between the continuous metal auxiliary electrode 111 of the first leading wiring inside the sealing member and a continuous metal auxiliary electrode 112' of adjacent second leading wiring outside the sealing member. As the effect of the permeation of moisture from the continuous metal auxiliary electrode 112' of the second leading wiring outside the sealing member into the continuous metal auxiliary electrode 111 of the first leading wiring inside the sealing member is reduced by configuring as described above even if moisture permeates from the outside of the sealing member, the embodiment is desirable. The continuous metal auxiliary electrode 111' of the first leading wiring outside the sealing member and a continuous metal auxiliary electrode 112 of the second leading wiring inside the sealing member are also similar. The relation between the first leading wiring and the second leading wiring is similar to relation between the second leading wiring and third leading wiring adjacent on the reverse side to the first leading wiring.

Figure 12:
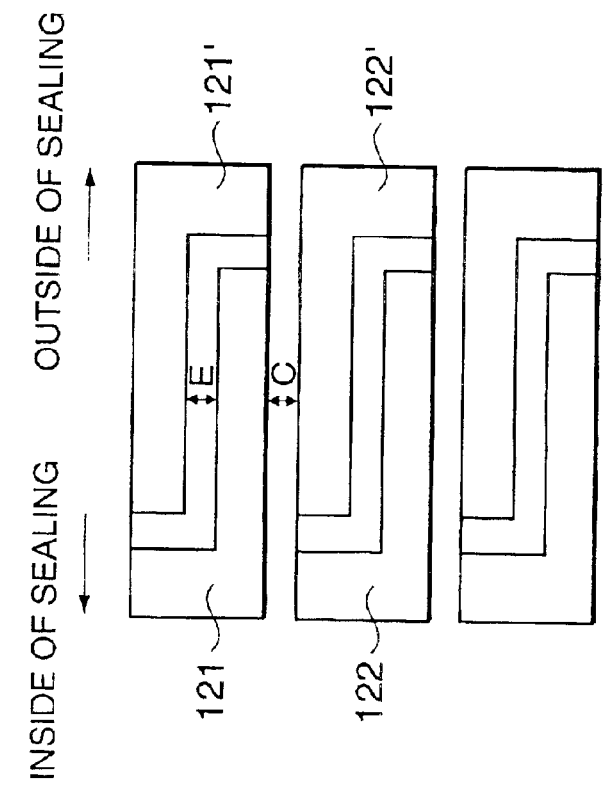
FIG. 12 is a plan showing a reference example for an eighth embodiment of the part in which the leading wiring and the sealing member of the organic electroluminescent device according to the invention are bonded.

On the other hand, FIG. 12 shows a case that a transparent electrode exposed pattern of a bonded part of leading wiring and a sealing member is formed so that adjacent leading wirings via the same space as that in FIG. 11 have the same pattern. When the leading wirings of the same pattern are arranged in parallel as described above, distance C between a continuous metal auxiliary electrode 121 of first leading wiring inside the sealing member and a continuous metal auxiliary electrode 122' of adjacent second leading wiring outside the sealing member is similar to or shorter than distance E between a continuous metal auxiliary electrode 121 of the first leading wiring inside the sealing member and a continuous metal auxiliary electrode 121' of the first leading wiring outside the sealing member, and as the distance C is shorter than the distance B shown in FIG. 11 and effect from the continuous metal auxiliary electrode of adjacent wiring outside the sealing member is easily produced, the case is not desirable.

For a transparent electrode exposed pattern of a bonded part of leading wiring and a sealing member, not only the case shown in FIG. 12 that the adjacent leading wirings have the same pattern but a case that parts the side end faces of which are opposite between the continuous metal auxiliary electrode of the first leading wiring inside the sealing member and the continuous metal auxiliary electrode of the second leading wiring outside the sealing member exist, particularly a case that the part is long are undesirable.

Figure 13:
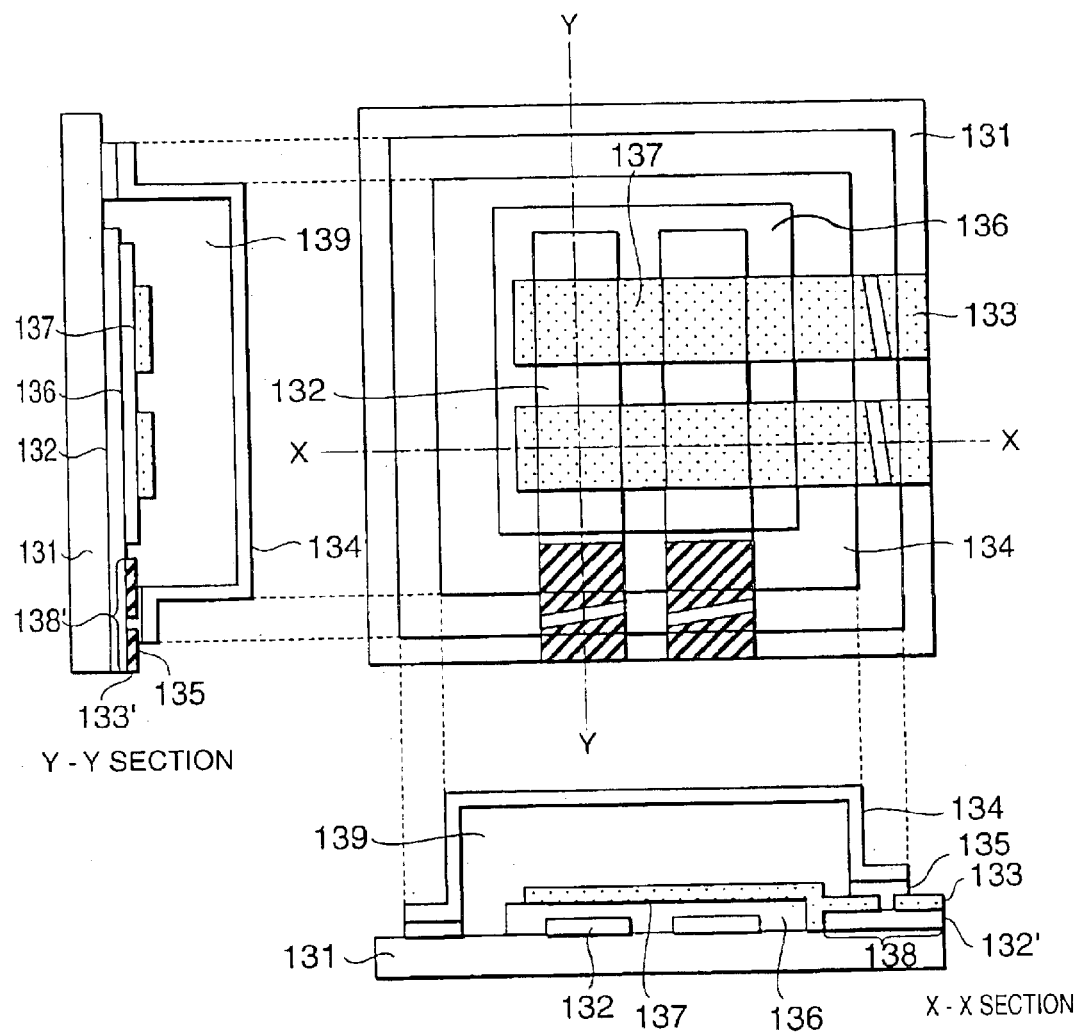
FIG. 13 is a plan and sectional views taken along the lines X—X and Y—Y in the plan showing another example of the organic electroluminescent device according to the invention.

FIG. 13 is a plan and a sectional view taken along the lines X—X and Y—Y in the plan showing another embodiment of the organic electroluminescent device according to the invention. A transparent electrode 132 to be a front electrode is formed in a display area and a transparent electrode 132' forming leading wiring is formed respectively on a transparent substrate 131. An organic thin film 136 is formed on the transparent electrode 132 and an organic electroluminescent element is formed by laminating a back electrode 137 opposite to the transparent electrode 132 on the organic thin film 136. In the meantime, a metal auxiliary electrode 133 is laminated on the transparent electrode 132' and leading wiring 138 is formed. A sealing member 134 located so that it covers the organic electroluminescent element is bonded and fixed over the substrate 131 and the leading wiring 138 by an adhesive 135. Inert gas or inert liquid 139 is filled with the space between the sealing member 134 and the transparent substrate 131.

The above-mentioned configuration is the same as that shown in FIG. 4, however, in FIG. 13, a metal auxiliary electrode 133' is also formed on a transparent electrode that functions as the leading wiring led from the front electrode and one or plural locations that crosses/cross the metal auxiliary electrode and is/are non-continuous in the longitudinal direction of the metal auxiliary electrode is/are formed in the metal auxiliary electrode located in the bonded part of the transparent substrate and the sealing member. The resistance of not only the back electrode but the front electrode can be reduced by such configuration.

Next, the manufacturing process of the organic electroluminescent device according to the invention will be described. The organic electroluminescent device according to the invention can be manufactured using a method known as a method of manufacturing an organic electroluminescent device.

A metal auxiliary electrode is formed on a substrate on which a transparent electrode is patterned so that it is separated into one or more transparent electrodes in a bonded part and next, after an organic thin film and a back electrode are formed in order, a sealing member is bonded in the atmosphere of inert gas by a ultraviolet cured adhesive and the organic electroluminescent device according to the invention is acquired.

As described above, the organic electroluminescent device according to the invention can be manufactured by a general method used for manufacturing an organic electroluminescent device except that the part in which the transparent electrode is exposed (the non-continuous part of the metal auxiliary electrode) is formed in the leading wiring located in the bonded part with the sealing member so that the part/parts connects/connect both side ends of the leading wiring.

As described in detail above, as in the organic electroluminescent device according to the invention, one or plural parts in which the transparent electrode is exposed (the non-continuous part of the metal auxiliary electrode) is/are formed in the leading wiring located in the bonded part of the leading wiring and the sealing member so that the part/parts crosses/cross both side ends of the leading wiring, the yield is enhanced, the permeation of moisture from the outside can be inhibited, the life is extended and the quality of display is enhanced.

Although the invention has been described above in connection with several preferred embodiments, it will be apparent to those skills in the art that many alternative embodiments can be produced by substitution of equivalent structures or techniques.

All such alternative embodiments are expressly understood within the true scope and spirit of the appended claims.

What is claimed is:

1. An organic electroluminescent device comprising:
   a transparent substrate;
   a transparent electrode formed on the transparent substrate and being a front electrode in a display device;
   an organic thin film layer formed on said transparent electrode substrate;
   a back electrode formed opposite to the front electrode on the organic thin film layer;
   a metal auxiliary electrode to be a leading wiring on one of said transparent electrode and said back electrode outside the display area; and
   a sealing member bonded and fixed to the transparent substrate so that it encircles the display area, wherein at least one discontinuity is formed in or adjacent said metal auxiliary electrode in a region wherein the sealing member is bonded to an underlying transparent electrode, said discontinuity extending across an entire width of said metal auxiliary electrode.

2. An organic electroluminescent device comprising:

a transparent substrate;

a transparent electrode formed on the transparent substrate and being a front electrode in a display device;

an organic thin film layer formed on the transparent electrode to be a front electrode in a display area;

a back electrode formed opposite to the front electrode on the organic thin film layer;

a first metal auxiliary electrode for a leading wiring connected to an outside of said sealing member a second metal auxiliary electrode for said leading wiring connected to an inside of said sealing member; and a sealing member bonded and fixed to the transparent electrode so that it encircles the display area wherein said first metal auxiliary electrode and said second metal auxiliary electrode are fully separated from each other in a plan view.

3. The organic electroluminescent device according to claim 2, wherein a length of each opposite part of said first metal auxiliary electrode and said second metal auxiliary electrode in the bonded part of said leading wiring and said sealing member is longer than a width of said leading electrode.

4. The organic electroluminescent device according to claim 1, wherein the metal auxiliary electrode is provided to be the leading wiring of the back electrode.

5. The organic electroluminescent device according to claim 1, wherein said discontinuity occupies an area in a range of 50% to 90% of the whole area of said bonded part.

6. The organic electroluminescent device according to claim 2, wherein said separation occupies an area in a range of 50% to 90% of the whole area of said bonded part.

7. The organic electroluminescent device according to claim 1, wherein a resistance value of the leading wiring is 30 Ω or less.

8. The organic electroluminescent device according to claim 2, wherein: a resistance value of the leading wiring is 30 Ω or less.

9. The organic electroluminescent device according to claim 1 wherein: the leading wiring and the sealing member are bonded by a ultraviolet cured adhesive.

10. The organic electroluminescent device according to claim 2, wherein: the leading wiring and the sealing member are bonded by a ultraviolet cured adhesive.

11. The organic electroluminescent device according to claim 1, wherein:

the organic thin film layer has one of a configuration including only an organic luminescent layer, a configuration composed of an organic luminescent layer and an electron transport layer, a configuration composed of an organic luminescent layer and a hole transport layer and a configuration composed of a hole transport layer, an organic luminescent layer and an electron transport layer.

12. The organic electroluminescent device according to claim 2, wherein:

the organic thin film layer has one of a configuration including only an organic luminescent layer, a configuration composed of an organic luminescent layer and an electron transport layer, a configuration composed of an organic luminescent layer and a hole transport layer and a configuration composed of a hole transport layer, an organic luminescent layer and an electron transport layer.

13. The organic electroluminescent device according to claim 1, wherein a length of said discontinuity is greater than a width of said underlying electrode.

14. The organic electroluminescent device according to claim 1, wherein said discontinuity has a cranked shape.

15. The organic electroluminescent device according to claim 1, wherein said discontinuity has a wavy shape.

16. An organic electroluminescent device comprising:

a transparent substrate;

plural transparent electrodes formed on the transparent substrate and being a front electrodes in a display device;

an organic thin film layer formed on the transparent electrode substrate;

plural back electrodes respectively formed opposite to the front electrode on the organic thin film layer;

plural metal auxiliary electrodes to be a leading wiring respectively on one of the plural transparent electrodes and the plural back electrodes outside the display device; and a sealing member bonded and fixed to the transparent substrate so that it encircles the display area, wherein at least one of said plural metal auxiliary electrodes includes at least one discontinuity that extends across a full width of said metal auxiliary electrode in a bonded part of the transparent substrate and the sealing member.

17. The organic electroluminescent device according to claim 16, wherein a discontinuity in a first metal auxiliary electrode is a mirror image of a discontinuity in a second metal auxiliary electrode.

18. The organic electroluminescent device according to claim 16, wherein:

the metal auxiliary electrode is provided to be each leading wiring of the plural back electrode.

19. The organic electroluminescent device according to claim 16, wherein a length of said discontinuity is greater than a width of said leading wiring.

20. An organic electroluminescent device comprising:

a transparent substrate;

plural transparent electrodes formed on the transparent substrate and being front electrodes in a display area;

an organic thin film layer formed on the transparent electrode;

plural back electrodes respectively formed opposite to the front electrode on the organic thin film layer;

plural metal auxiliary electrodes to be a leading wiring respectively on the plural transparent electrodes outside the display area; and a sealing member bonded and fixed to the transparent substrate so that it encircles the display area, wherein at least one of said plural metal auxiliary electrodes includes a first part for a leading wiring connected to an outside of said sealing member and a second part for said leading wiring connected to an inside of said sealing member, and wherein said first part and said second part are fully separated from each other in a plan view.

21. The organic electroluminescent device according to claim 20 wherein a distance between said first part of a first metal auxiliary electrode and a second part of said first metal auxiliary electrode is shorter than a distance between said first part of said first metal auxiliary electrode and a second part of a second metal auxiliary electrode.

22. The organic electroluminescent device according to claim 20, wherein a length of each opposite part of first part for a leading wiring connected to an outside of said sealing member and a second part for a leading wiring connected to an inside of said sealing member is longer than a width of said leading wiring.

23. An organic electroluminescent device comprising:

a transparent substrate;

a first transparent electrode formed on the transparent substrate and being a front electrode in a display device;

a second transparent electrode formed on the transparent substrate;

an organic thin film layer formed on said first transparent electrode, said second transparent electrode being disposed entirely outside said organic thin film layer;

a back electrode formed opposite to the front electrode on the organic thin film layer;

a metal auxiliary electrode to be a leading wiring laminated on said second transparent electrode outside the display area; and a sealing member bonded and fixed to the transparent substrate so that it encircles the display area, wherein said metal auxiliary electrode comprises at least one opening exposing said second transparent electrode in a region wherein the sealing member is bonded to the metal auxiliary electrode and to said second transparent electrode.

* * * * *